United States Patent
Vashchenko et al.

(10) Patent No.: US 6,433,368 B1
(45) Date of Patent: Aug. 13, 2002

(54) LVTSCR WITH A HOLDING VOLTAGE THAT IS GREATER THAN A DC BIAS VOLTAGE ON A TO-BE-PROTECTED NODE

(75) Inventors: Vladislav Vashchenko, Fremont; Peter J. Hopper, San Jose, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/768,033

(22) Filed: Jan. 22, 2001

(51) Int. Cl.[7] .......................... H01L 29/74; H01L 23/62
(52) U.S. Cl. ...................... 257/173; 257/358; 257/141; 257/357
(58) Field of Search ................................ 257/357, 358, 257/141, 173, 175

(56) References Cited

U.S. PATENT DOCUMENTS 6,049,111 A * 4/2000 Higuchi et al. ............. 257/355
6,233,130 B1 * 5/2001 Lin ............................. 361/118

* cited by examiner

Primary Examiner—Jerome Jackson, Jr.
(74) Attorney, Agent, or Firm—Mark C. Pickering

(57) ABSTRACT

The holding voltage (the minimum voltage required for operation) of a low-voltage triggering silicon-controlled rectifier (LVTSCR) is increased to a value that is greater than a dc bias on a to-be-protected node. The holding voltage is increased by inserting a voltage drop between the to-be-protected node and the emitter of the pnp transistor of the LVTSCR. As a result, the LVTSCR can be utilized to provide ESD protection to power supply pins.

19 Claims, 5 Drawing Sheets

LVTSCR WITH A HOLDING VOLTAGE THAT IS GREATER THAN A DC BIAS VOLTAGE ON A TO-BE-PROTECTED NODE

BACKGROUND OF THE INVENTION

1. Field of the Invention

The present invention relates to a low-voltage triggering silicon-controlled rectifier (LVTSCR) and, more particularly, to a LVTSCR with a holding voltage that is greater than a dc bias voltage on a to-be-protected node.

2. Description of the Related Art

A silicon-controlled rectifier (SCR) is a device that provides an open circuit between a first node and a second node when the voltage across the first and second nodes is positive and less than a trigger voltage. When the voltage across the first and second nodes rises to be equal to or greater than the trigger voltage, the SCR provides a low-resistance current path between the first and second nodes. Further, once the low-resistance current path has been provided, the SCR maintains the current path as long as the voltage across the first and second nodes is equal to or greater than a holding voltage that is lower than the trigger voltage.

As a result of these characteristics, SCRs have been used to provide electro-static discharge (ESD) protection. When used for ESD protection, the first node becomes a to-be-protected node, and the second node becomes an output node. The SCR operates within an ESD protection window that has a maximum voltage defined by the destructive breakdown level of the to-be-protected node, and a minimum voltage (also known as a latch-up voltage) defined by any dc bias on the to-be-protected node. The trigger voltage of the SCR is then set to a value that is less than the maximum voltage of the window, while the holding voltage is set to a value that is greater than the minimum voltage of the window.

Thus, when the voltage across the to-be-protected node and the output node is less than the trigger voltage, the SCR provides an open circuit between the to-be-protected node and the output node. However, when the to-be-protected node receives a voltage spike that equals or exceeds the trigger voltage, such as when an ungrounded human-body contact occurs, the SCR provides a low-resistance current path from the to-be-protected node to the output node. In addition, once the ESD event has passed and the voltage on the to-be-protected node falls below the holding voltage, the SCR again provides an open circuit between the to-be-protected node and the output node.

FIG. 1 shows a cross-sectional view that illustrates a conventional SCR 100. As shown in FIG. 1, SCR 100 has a n-well 112 which is formed in a p-type semiconductor material 110, such as a substrate or a well, and a n+ region 114 and a p+ region 116 which are formed in n-well 112. N+ and p+ regions 114 and 116, in turn, are both connected to a to-be-protected node 120. As further shown in FIG. 1, SCR 100 also has a n+ region 122 and a p+ region 124 formed in semiconductor material 110. N+ and p+ regions 122 and 124, in turn, are both connected to an output node 126.

In operation, when the voltage across nodes 120 and 126 is positive and less than the trigger voltage, the voltage reverse biases the junction between n-well 112 and p-type material 110. The reverse-biased junction, in turn, blocks charge carriers from flowing from node 120 to node 126. However, when the voltage across nodes 120 and 126 is positive and equal to or greater than the trigger voltage, the reverse-biased junction breaks down due to avalanche multiplication.

The breakdown of the junction causes a large number of holes to be injected into material 110, and a large number of electrons to be injected into n-well 112. The increased number of holes increases the potential of material 110 in the region that lies adjacent to n+ region 122, and eventually forward biases the junction between material 110 and n+ region 122.

When the increased potential forward biases the junction, a npn transistor that utilizes n+ region 122 as the emitter, p-type material 110 as the base, and n-well 112 as the collector turns on. When turned on, n+ (emitter) region 122 injects electrons into (base) material 110. Most of the injected electrons diffuse through (base) material 110 and are swept from (base) material 110 into (collector) n-well 112 by the electric field that extends across the reverse-biased junction. The electrons in (collector) n-well 112 are then collected by n+ region 114.

A small number of the electrons injected into (base) material 110 recombine with holes in (base) material 110 and are lost. The holes lost to recombination with the injected electrons are replaced by holes injected into (base) material 110 by the broken-down reverse-biased junction and, as described below, by the collector current of a pnp transistor, thereby providing the base current.

The electrons that are injected and swept into n-well 112 also decrease the potential of n-well 112 in the region that lies adjacent to p+ region 116, and eventually forward bias the junction between p+ region 116 and n-well 112. When the decreased potential forward biases the junction between p+ region 116 and n-well 112, a pnp transistor formed from p+ region 116, n-well 112, and material 110 turns on.

When turned on, p+ emitter 116 injects holes into base 112. Most of the injected holes diffuse through (base) n-well 112 and are swept from (base) n-well 112 into (collector) material 110 by the electric field that extends across the reverse-biased junction. The holes in (collector) material 110 are then collected by p+ region 124.

A small number of the holes injected into (base) n-well 112 recombine with electrons in (base) n-well 112 and are lost. The electrons lost to recombination with the injected holes are replaced by electrons flowing into n-well 112 as a result of the broken-down reverse-biased junction, and n-well 112 being the collector of the npn transistor. Thus, a small part of the npn collector current forms the base current of the pnp transistor.

Similarly, as noted above, the holes swept into (collector) material 110 also provide the base current holes necessary to compensate for the holes lost to recombination with the diffusing electrons injected by n+ (emitter) region 122. Thus, a small part of the pnp collector current forms the base current of the npn transistor.

Thus, n+ region 122 injects electrons that provide both the electrons for the collector current of the npn transistor as well as the electrons for the base current of the pnp transistor. At the same time, p+ region 116 injects holes that provide both the holes for the collector current of the pnp transistor as well as the holes for the base current of the npn transistor.

One of the advantages of SCR 100 over other ESD protection devices, such as a grounded-gate MOS transistor, is the double injection provided by n+ region 122 and p+ region 116 of SCR 100. With double injection, SCR 100 provides current densities (after snapback) that are about ten times greater than the densities provided by a grounded-gate MOS device, thus increasing the ESD protection capability. (Protection capability can be defined as the required contact width of the structure required to protect from a given ESD pulse amplitude, or the maximum protected ESD pulse amplitude for a given contact width.) One of the disadvantages of SCR 100, however, is that a very large positive voltage, e.g., 50 volts, must be dropped across nodes 120 and 126 before the junction between p-type material 110 and n-well 112 breaks down. As a result, SCR 100 can not be used to protect devices, such as MOS transistors, that can be permanently damaged by much lower voltages, e.g., 15 volts.

One solution to this problem, known as a low-voltage triggering SCR (LVTSCR), incorporates a NMOS transistor into SCR 100. FIG. 2 shows a cross-sectional diagram that illustrates a conventional LVTSCR 200. LVTSCR 200 and SCR 100 are similar and, as a result, utilize the same reference numerals to designate the structures that are common to both devices.

As shown in FIG. 2, LVTSCR 200 differs from SCR 100 in that LVTSCR 200 has a n+ (drain) region 230 that is formed in both material 110 and n-well 112, and a channel region 232 that is defined between n+ (source) region 122 and n+ (drain) region 230. In addition, LVTSCR 200 includes a gate oxide layer 234 that is formed on material 110 over channel region 232, and a gate 236 that is formed on gate oxide layer 234. N+ (source and drain) regions 122 and 230, gate oxide layer 234, and gate 236 define a NMOS transistor 238 which is typically formed to be identical to the to-be-protected MOS transistors in the circuit.

In operation, when the voltage on the drain of a conventional NMOS transistor spikes up, the drain-to-substrate junction of the NMOS transistor breaks down, for example, at 7 volts, while the gate oxide layer that isolates the gate from the drain destructively breaks down at, for example, 10–15 volts.

Since NMOS transistor 238 is formed to be identical to the to-be-protected MOS transistors, the junction between n+ region 230 and material 110 breaks down at the same time that the to-be-protected MOS transistors experience junction break down as a result of an ESD pulse. Once the reverse-biased junction between region 230 and material 110 breaks down, the break down triggers LVTSCR 200 to operate the same as SCR 100.

Since junction break down occurs before the MOS transistors experience destructive gate oxide break down, LVTSCR 200 turns on before destructive gate oxide breakdown occurs, thereby protecting the MOS transistors. Thus, the junction break down voltage, which is less than the voltage level that causes destructive gate oxide break down, functions as the trigger voltage. In addition, other techniques, such as reducing the width of channel region 232, can be used to lower the trigger voltage so that the region 230 to material 110 junction breaks down before the to-be-protected MOS transistors experience junction break down.

Thus, LVTSCR 200 provides a SCR with a significantly lower turnon voltage that allows MOS transistors to be protected from ESD events with an SCR. One disadvantage of LVTSCR 200, however, is that LVTSCR 200 suffers from a holding voltage that is often less than the minimum (or latch-up) voltage of the ESD protection window. As a result, LVTSCRs are unattractive candidates for providing ESD protection to power supply pins.

When the minimum (or latch-up) voltage of the ESD protection window is equal to a dc bias, such as the power supply voltage, and the holding voltage is less than the minimum voltage, LVTSCR 200 can not turn off (thus latching up) after the ESD event has passed. Thus, power must be cycled after the ESD event.

For example, assume that node 120 is a power supply pin at 3.3 volts, node 126 is a ground pin, the junction breakdown voltages of the to-be-protected MOS transistors are 7.0 volts, and the holding voltage is 1.8 volts. In this example, LVTSCR 200 is turned off under normal operating conditions when the voltage on node 120 is 3.3 volts. When the voltage on node 120 spikes up to a value equal to or greater than the trigger voltage (7 volts in this example), LVTSCR 200 turns on, thereby protecting the MOS devices that receive power from node 120.

However, once the ESD event has passed, it takes only 1.8 volts on node 120 to keep LVTSCR 200 in this example turned on. Since the normal operating voltage on node 120 is 3.3 volts, LVTSCR 200 remains turned on (latched up) after the ESD event has passed. Thus, to provide ESD protection to lines with a dc bias, such as power supply lines, via a LVTSCR, there is a need for a LVTSCR with a holding voltage that is greater than the dc bias.

SUMMARY OF THE INVENTION

The present invention provides a low-voltage triggering silicon-controlled rectifier (LVTSCR) that increases the value of the holding voltage by inserting a voltage drop circuit between a to-be-protected node with a dc bias, such as a power supply node, and the emitter of the pnp transistor of the LVTSCR.

A low-voltage triggering silicon-controlled rectifier (LVTSCR) in accordance with the present invention is formed in a semiconductor material of a first conductivity type, and includes a well of a second conductivity type that is formed in the semiconductor material. The LVTSCR also includes a first region of the second conductivity type that is formed in the well, and a second region of the first conductivity type that is formed in the well. The first region is connected to a first node.

The LVTSCR further includes a third region of the second conductivity type that is formed in the semiconductor material, and a fourth region of the first conductivity type that is formed in the semiconductor material. The third and fourth regions are connected to a second node. The LVTSCR additionally includes a fifth region of the second conductivity type that is formed in the semiconductor material and the well, and a voltage drop circuit that is connected between the second region and the first node.

The present invention also includes a method for operating the LVTSCR that includes the steps of placing a first voltage on the first region, and a second voltage on the second region. The first and second voltages are different. In addition, the method includes the step of placing a third voltage on the third and fourth regions.

A better understanding of the features and advantages of the present invention will be obtained by reference to the following detailed description and accompanying drawings that set forth an illustrative embodiment in which the principles of the invention are utilize

DETAILED DESCRIPTION

Figure 1:
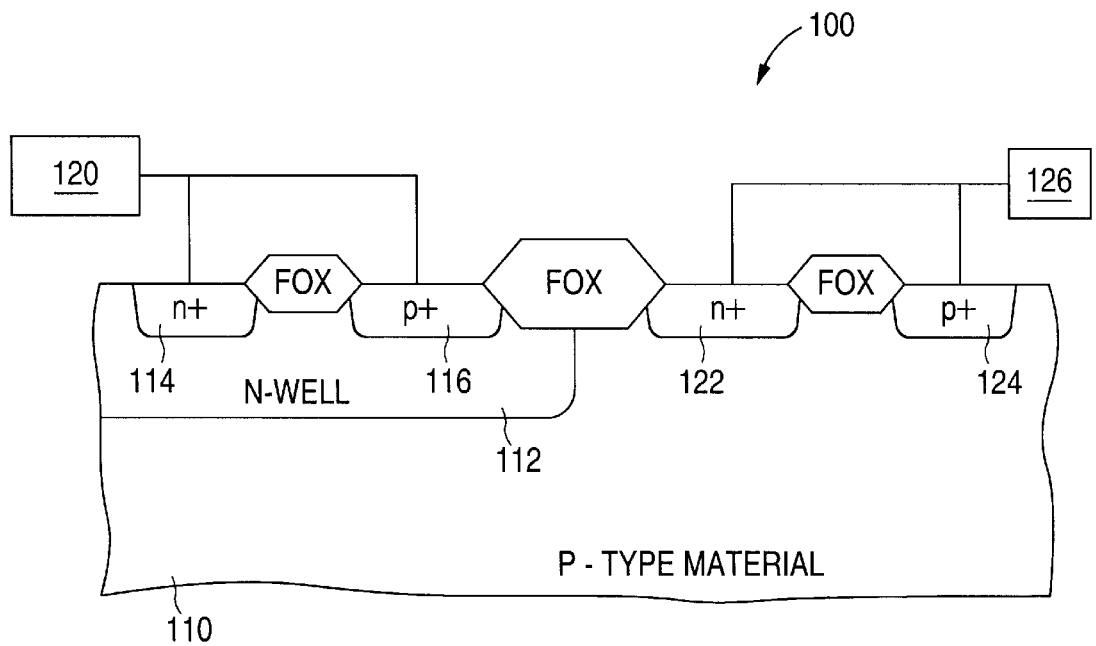
FIG. 1 is a cross-sectional view illustrating a conventional SCR 100.
Figure 2:
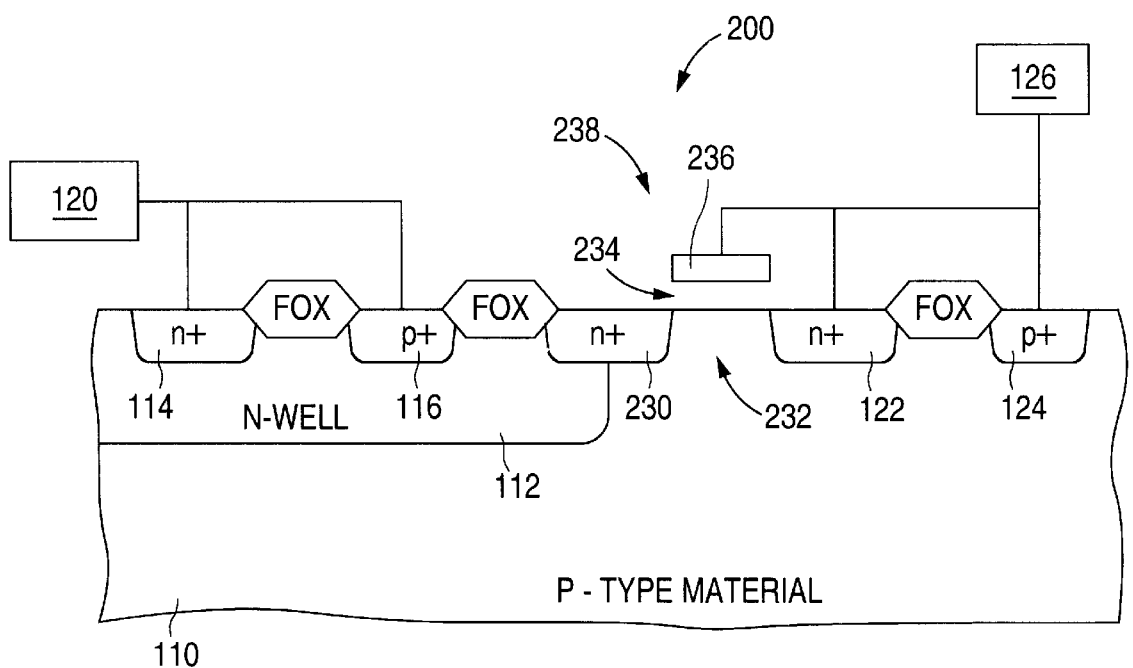
FIG. 2 is a cross-sectional diagram illustrating a conventional LVTSCR 200.
Figure 3:
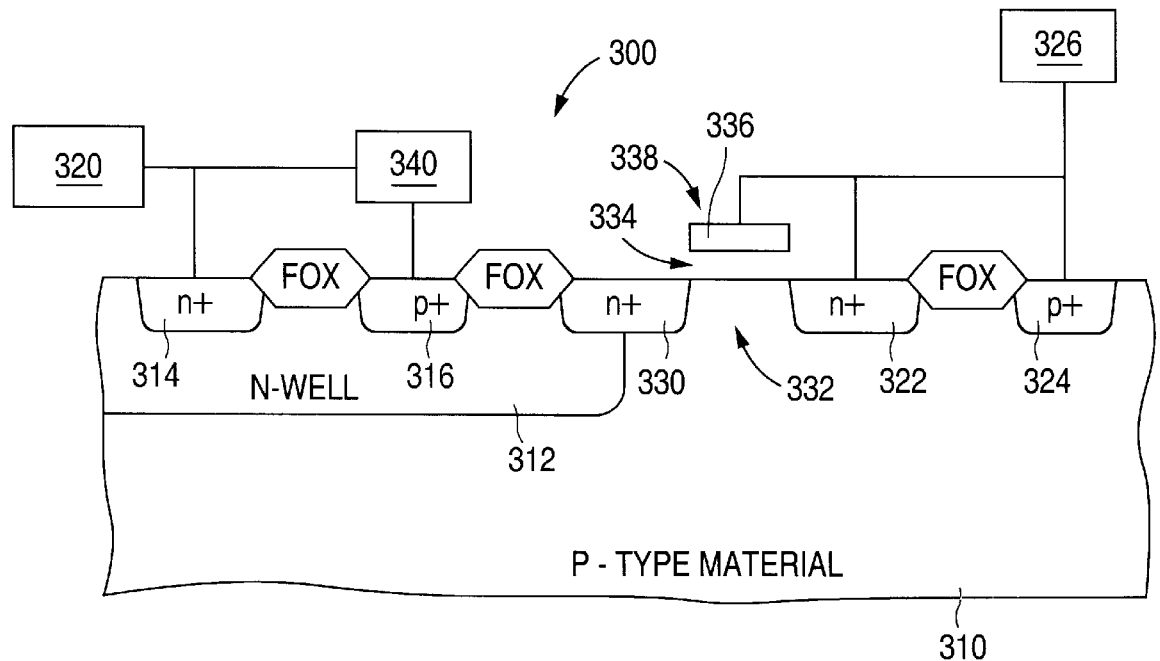
FIG. 3 is a cross-sectional view illustrating a low-voltage triggering silicon-controlled rectifier (LVTSCR) 300 in accordance with the present invention.

FIG. 3 shows a cross-sectional view that illustrates a low-voltage triggering silicon-controlled rectifier (LVTSCR) 300 in accordance with the present invention. As described in greater detail below, LVTSCR 300 increases the value of the holding voltage by inserting a voltage drop between a to-be-protected node with a dc bias and the emitter of the pnp transistor of LVTSCR 300.

As shown in FIG. 3, LVTSCR 300 has a n-well 312 which is formed in a p-type semiconductor material 310, such as a substrate or a well, and a n+ region 314 and a p+ region 316 which are formed in n-well 312. N+ region 314, in turn, is connected to a first node 320. As further shown in FIG. 3, LVTSCR 300 also has a n+ region 322 and a p+ region 324 which are formed in semiconductor material 310. N+ region 322 and p+ region 324, in turn, are both connected to a second node 326.

In addition, LVTSCR 300 has an n+ (drain) region 330 that is formed in material 310 and n-well 312, and a channel region 332 that is defined between n+ (source) region 322 and n+ (drain) region 330. In addition, LVTSCR 300 includes a gate oxide layer 334 that is formed on material 310 over channel region 332, and a gate 336 that is formed on gate oxide layer 334. N+ (source and drain) regions 322 and 330, gate oxide layer 334, and gate 336 define a NMOS transistor 338 which is typically formed to be identical to the to-be-protected MOS transistors in the circuit.

Further, gate 336 is either directly connected to a ground node, or connected to the ground node via a resistive element. When node 326 is a ground node, gate 336 can be connected to node 326. Gate oxide layer 334 and gate 336 are optional elements of LVTSCR 300, but are conventionally used because of manufacturing and other considerations. (Gate 336, for example, self aligns the implants that form the n+ regions 322 and 330.)

In accordance with the present invention, LVTSCR 300 also includes a voltage drop circuit 340 that is connected between p+ (pnp emitter) region 316 and first node 320. In one embodiment of the present invention, voltage drop circuit 340 is implemented with a number of diodes.

Figure 4:
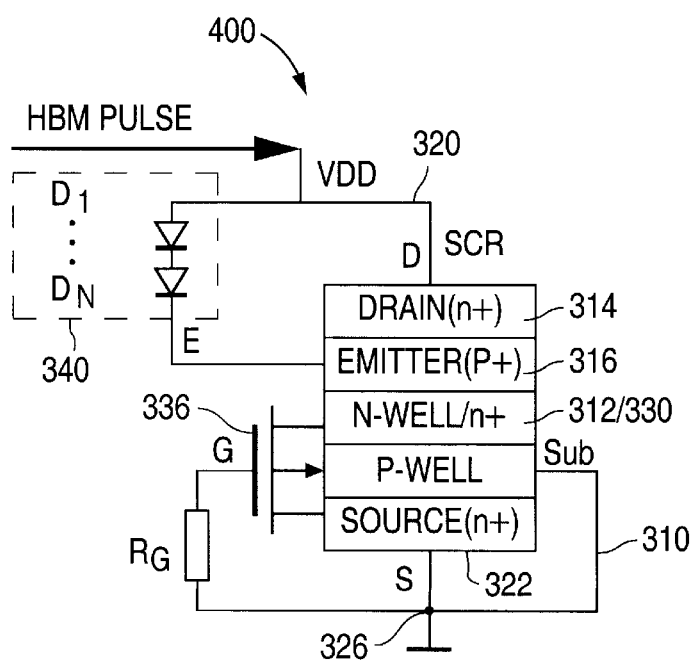
FIG. 4 is a schematic diagram illustrating a LVTSCR 400 in accordance with the present invention.

FIG. 4 shows a schematic diagram that illustrates a LVTSCR 400 in accordance with the present invention. As shown in FIG. 4, LVTSCR 400 is the same as LVTSCR 300 except that voltage drop circuit 340 is implemented in LVTSCR 400 with a number of diodes D1–Dn connected in series. The anode of the first diode D1 is connected to first node 320, while the cathode of diode Dn is connected to p+ region 316.

Figure 5:
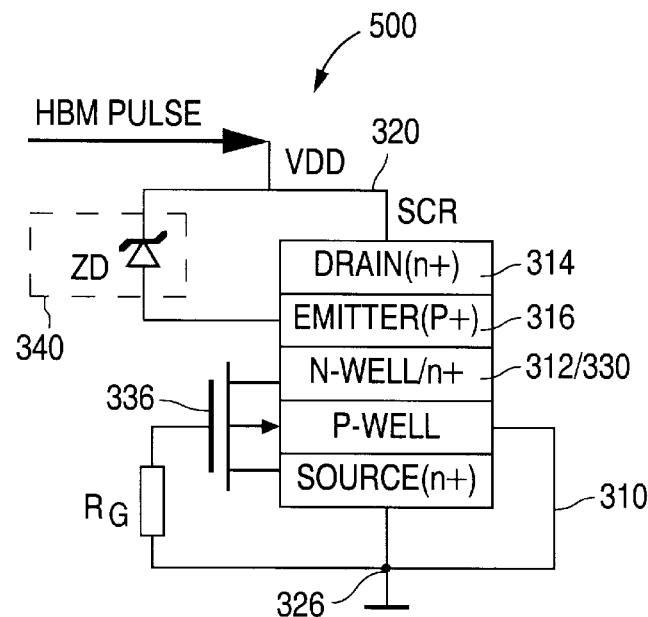
FIG. 5 is a schematic diagram illustrating a LVTSCR 500 in accordance with the present invention.

In another embodiment of the present invention, voltage drop circuit 340 is implemented with a zener diode. FIG. 5 shows a schematic diagram that illustrates a LVTSCR 500 in accordance with the present invention. As shown in FIG. 5, LVTSCR 500 is the same as LVTSCR 300 except that voltage drop circuit 340 is implemented in LVTSCR 500 with a zener diode ZD. The anode of zener diode ZD is connected to p+ region 316, while the cathode is connected to node 320.

In the operation of LVTSCRs 300, 400, and 500, when a voltage across nodes 320 and 326 is positive and less than the trigger voltage, the voltage reverse biases the junction between n+ (drain) region 330/n-well 312 and p-type material 310. The reverse-biased junction, in turn, blocks current from flowing from node 320 to node 326. On the other hand, when the voltage across nodes 320 and 326 is equal to or greater than the trigger voltage, the reverse-biased junction breaks down due to avalanche multiplication.

The breakdown of the junction causes a large number of holes to be injected into material 310, and a large number of electrons to be injected into n-well 312. The increased number of holes increases the potential of material 310 in the region that lies adjacent to n+ region 322, and eventually forward biases the junction between material 310 and n+ region 322. When the increased potential forward biases the junction between material 310 and n+ region 322, a npn transistor formed from n+ region 322, p-type material 310, and n-well 312 turns on.

When the npn transistor turns on, n+ region 322 injects electrons into material 310. Most of the injected electrons diffuse through (base) material 310 and are swept from (base) material 310 into (collector) n-well 312 by the electric field that extends across the reverse-biased junction. The electrons in (collector) n-well 312 are then collected by n+ region 314.

A small number of the electrons injected into (base) material 310 recombine with holes in (base) material 310 and are lost. The holes lost to recombination with the injected electrons are replaced by holes injected into (base) material 310 by the broken-down reverse-biased junction and, as described below, by the collector current of a pnp transistor, thereby providing the base current.

The electrons that are injected and swept into n-well 312 also decrease the potential of n-well 312 in the region that lies adjacent to p+ region 316, and eventually forward bias the junction between p+ region 316 and n-well 312. When the decreased potential forward biases the junction between p+ region 316 and n-well 312, a pnp transistor formed from p+ region 316, n-well 312, and p-type material 310 turns on.

When turned on, p+ emitter 316 injects holes into (base) n-well 312. Most of the injected holes diffuse through (base) n-well 312 and are swept from (base) n-well 312 into (collector) material 310 by the electric field that extends across the reverse-biased junction. The holes in (collector) material 310 are then collected by p+ region 324.

A small number of the holes injected into (base) n-well 312 recombine with electrons in (base) n-well 312 and are lost. The electrons lost to recombination with the injected holes are replaced by electrons flowing into n-well 312 as a result of the broken-down reverse-biased junction, and n-well 312 being the collector of the npn transistor. Thus, a small part of the npn collector current forms the base current of the pnp transistor.

Similarly, as noted above, the holes swept into (collector) material 310 also provide the base current holes necessary to compensate for the holes lost to recombination with the diffusing electrons injected by n+ (emitter) region 322. As a result, a small part of the pnp collector current forms the base current of the npn transistor.

Thus, n+ region 322 injects electrons that provide both the electrons for the collector current of the npn transistor as well as the electrons for the base current of the pnp transistor. At the same time, p+ region 316 injects holes that provide both the holes for the collector current of the pnp transistor as well as the holes for the base current of the npn transistor.

In accordance with the present invention, the voltage dropped across circuit 340, diodes D1–Dn, and diode ZD of LVTSCRs 300, 400, and 500, respectively, causes the voltage on p+ (pnp emitter) region 316 to be less than the voltage on n+ region 314. Thus, as an ESD event passes and the voltage on node 320 falls, the lower falling voltage on p+ region 316 reduces the forward bias across the junction between p+ region 316 and n-well 312, and eventually substantially reduces the number of holes injected into n-well 312.

Reducing the number of holes injected into n-well 312 reduces the number of holes that are swept into material 310. Since the holes that are swept into material 310 form both the pnp collector current and the npn base current, a reduced pnp collector current means a reduced npn base current. Reducing the npn base current, in turn, reduces the number of electrons that are injected into material 310 from n+ (npn emitter) region 322. Thus, when the number of holes flowing into material 310 decreases, the number of electrons injected into material 310 from n+ region 322 also decreases to maintain space charge neutrality.

Reducing the number of holes that are injected by p+ (pnp emitter) region 316 and the number of electrons that are injected by n+ (npn emitter) region 322 increases the holding voltage of LVTSCR 300. Thus, by properly setting the magnitude of the voltage dropped across voltage drop circuit 340, diodes D1–Dn, or zener diode ZD, the magnitude of the holding voltage of LVTSCR 300 can be increased above a dc bias that is present on the to-be-protected node. As a result, LVTSCRs 300, 400, and 500 turn off following an ESD event.

Figure 6:
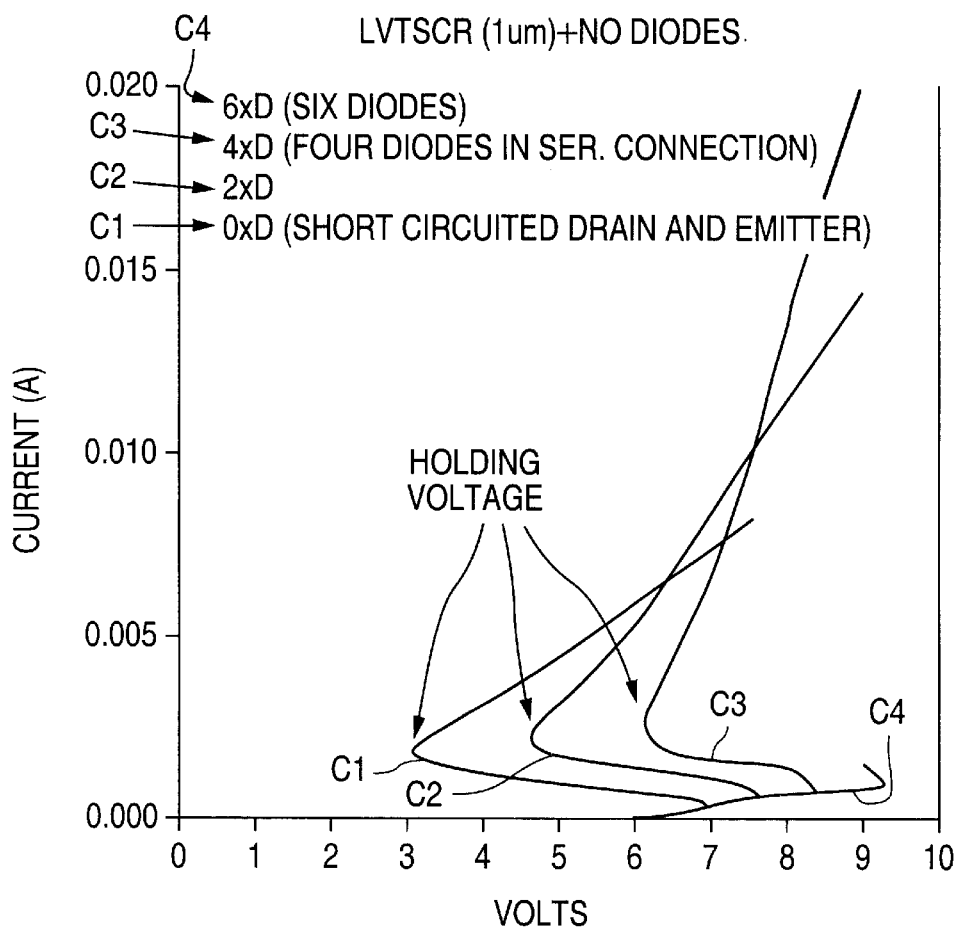
FIG. 6 is a graphical representation illustrating the isothermal DC-IV characteristics of three LVTSCRs in accordance with the present invention.

FIG. 6 shows a graphical representation that illustrates the isothermal DC-IV characteristics of three LVTSCRs in accordance with the present invention. In a first case C1, a LVTSCR is utilized with no voltage drop circuit 340 (conventional). In a second case C2, a LVTSCR is utilized with two diode voltage drops (LVTSCR 400 with diodes D1–D2 as voltage drop circuit 340).

In a third case C3, a LVTSCR is utilized with four diode voltage drops (LVTSCR 400 with diodes D1–D4 as voltage drop circuit 340). (The diodes provide a voltage drop of approximately 0.8 volts each. The three cases have been evaluated for a human-body model (HBM) ESD pulse using a thermally-coupled mixed-mode device simulation.) As shown in FIG. 6, increasing the voltage drop increases the holding voltage of the LVTSCR after snapback.

Figure 7:
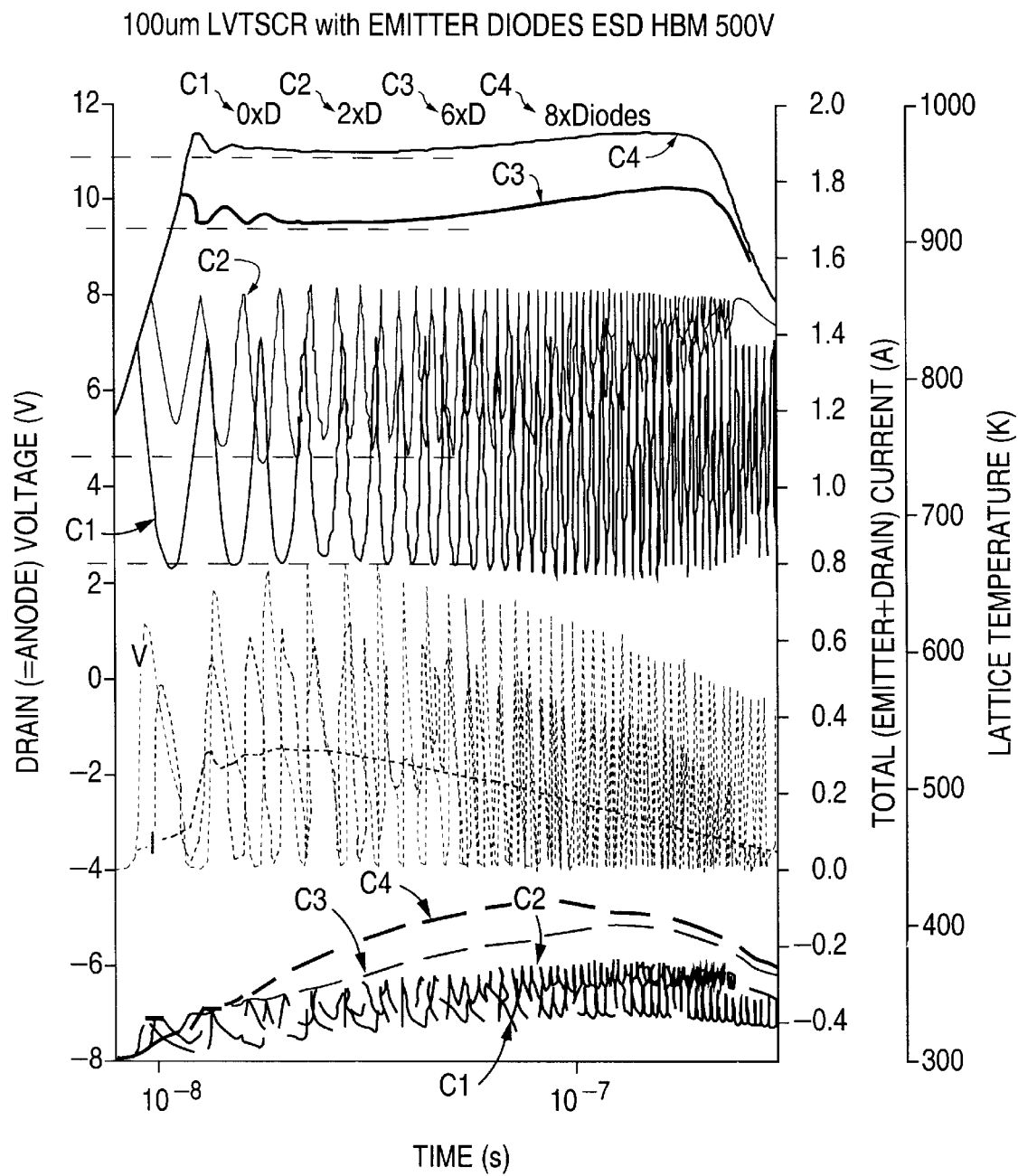
FIG. 7 is a graphical representation illustrating the minimum voltage limitations of three LVTSCRs in accordance with the present invention.

FIG. 7 shows a graphical representation that illustrates the minimum voltage limitations of three LVTSCRs in accordance with the present invention. In a first case C1, a LVTSCR is utilized with no voltage drop circuit 340 (conventional). In a second case C2, a LVTSCR is utilized with two diode voltage drops (LVTSCR 400 with diodes D1–D2 as voltage drop circuit 340).

In a third case C3, a LVTSCR is utilized with six diode voltage drops (LVTSCR 400 with diodes D1–D6 as voltage drop circuit 340). (The diodes provide a voltage drop of approximately 0.8 volts each. The three cases have been evaluated for a human-body model (HBM) ESD pulse using a thermally-coupled mixed-mode device simulation.) As shown in FIG. 7, increasing the voltage drop increases the holding voltage (minimum voltage required for operation) of the LVTSCR after snapback.

Figure 8:
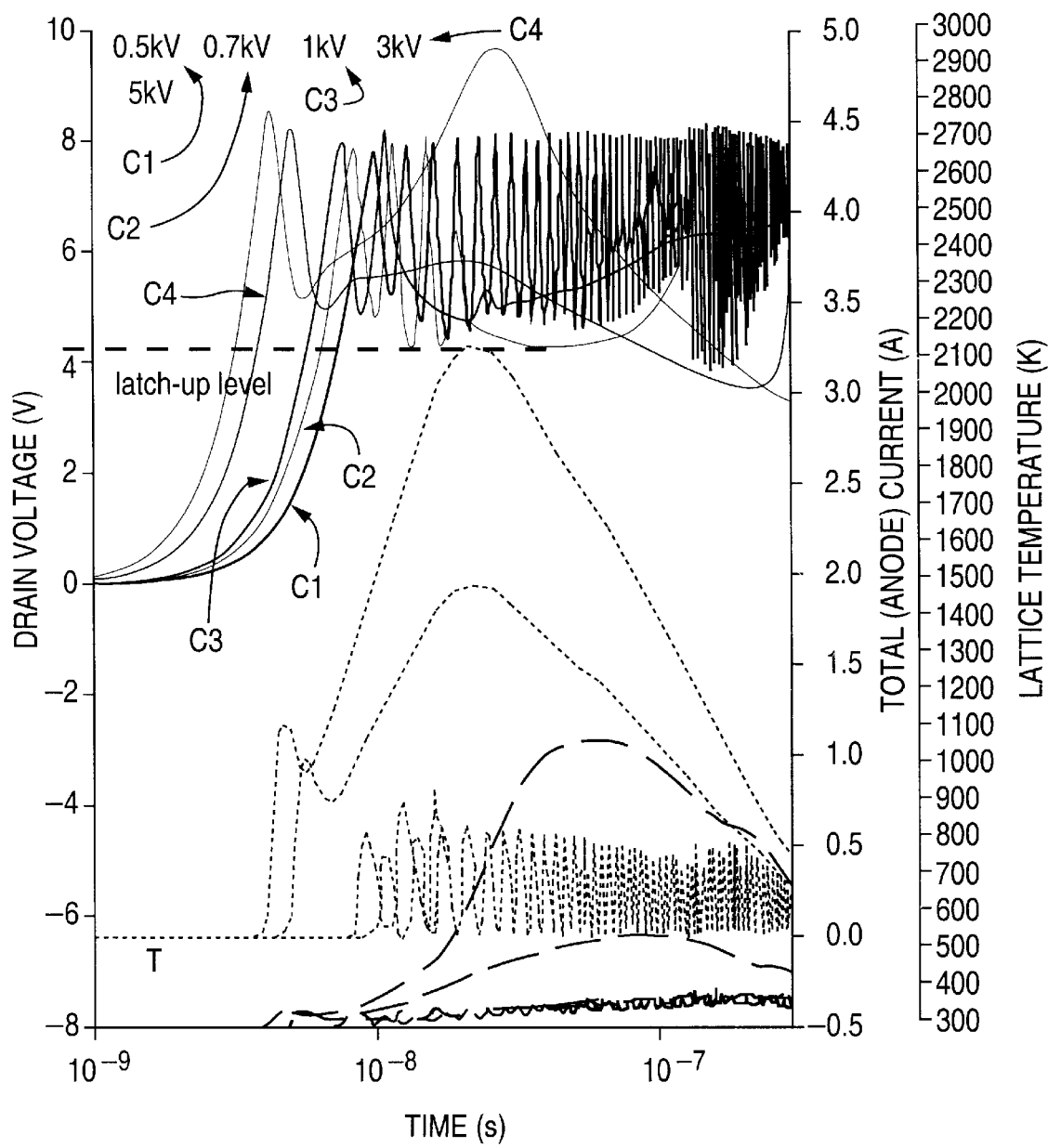
FIG. 8 is a graphical representation illustrating supporting the minimum voltage limitations for a two diode LVTSCR in accordance with the present invention.

FIG. 8 shows a graphical representation that illustrates supporting the minimum voltage limitations for a two-diode LVTSCR in accordance with the present invention. In a first case C1, a 0.5 kV pulse was applied. In a second case C2, a 0.75 kV pulse was applied, while in a third case C3, a 1 kV pulse was applied. (The diodes provide a voltage drop of approximately 0.8 volts each. The three cases have been evaluated for a human-body model (HBM) ESD pulse using a thermally-coupled mixed-mode device simulation.)

As shown in FIG. 8, the LVTSCR of the present invention operates properly even at the point of critical ESD pulse overload, near the physical limitation of the protection circuit, where Joule overheating results in a voltage increase due to the mobility decrease and current saturation.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A low-voltage triggering silicon-controlled rectifier (LVTSCR) formed in a semiconductor material of a first conductivity type, the semiconductor material having a dopant concentration, the LVTSCR comprising:

a well of a second conductivity type formed in the semiconductor material, the well having a dopant concentration;

a first region of the second conductivity type formed in the well, the first region having a dopant concentration greater than the dopant concentration of the well, the first region being connected to a first node;

a second region of the first conductivity type formed in the well, the second region having a dopant concentration greater than the dopant concentration of the semiconductor material;

a third region of the second conductivity type formed in the semiconductor material, the third region having a dopant concentration greater than the dopant concentration of the well, the third region being connected to a second node;

a fourth region of the first conductivity type formed in the semiconductor material, the fourth region having a dopant concentration greater than the dopant concentration of the semiconductor material, a fifth region of the second conductivity type formed in the semiconductor material and the well, the fifth region having a dopant concentration greater than the dopant concentration of the well; and a diode connected to the second region and the first node.

2. The LVTSCR of claim 1 wherein the diode has a cathode connected to the second region, and an anode.

3. The LVTSCR of claim 2 and further comprising:

a channel region defined in the semiconductor material between the third region and the fifth region; and a gate formed over the channel region.

4. The LVTSCR of claim 3 wherein the fourth region is connected to the second node.

5. The LVTSCR of claim 2 wherein the diode includes a plurality of diodes connected in series between the second region and the first node.

6. The LVTSCR of claim 5 and further comprising:

a channel region defined in the semiconductor material between the third region and the fifth region; and a gate formed over the channel region.

7. The LVTSCR of claim 1 wherein the diode includes a zener diode.

8. A low-voltage triggering silicon-controlled rectifier (LVTSCR) formed in a semiconductor material of a first conductivity type, the semiconductor material having a dopant concentration, the LVTSCR comprising:

a well of a second conductivity type formed in the semiconductor material, the well having a dopant concentration;

a first region of the second conductivity type formed in the well, the first region having a dopant concentration greater than the dopant concentration of the well, the first region being connected to a first node;

a second region of the first conductivity type formed in the well, the second region having a dopant concentration greater than the dopant concentration of the semiconductor material;

a third region of the second conductivity type formed in the semiconductor material, the third region having a dopant concentration greater than the dopant concentration of the well, the third region being connected to a second node;

a fourth region of the first conductivity type formed in the semiconductor material, the fourth region having a dopant concentration greater than the dopant concentration of the semiconductor material;

a fifth region of the second conductivity type formed in the semiconductor material and the well, the fifth region having a dopant concentration greater than the dopant concentration of the well; and a voltage drop circuit connected between the second region and the first node, the voltage drop circuit including a zener diode connected in series between the second region and the first node.

9. The LVTSCR of claim 8 and further comprising:

a channel region defined in the semiconductor material between the third region and the fifth region; and a gate formed over the channel region.

10. The LVTSCR of claim 9 wherein the fourth region is connected to the second node.

11. A method of operating a low-voltage triggering silicon-controlled rectifier (LVTSCR) formed in a semiconductor material of a first conductivity type, the semiconductor material having a dopant concentration, the LVTSCR comprising:

a well of a second conductivity type formed in the semiconductor material, the well having a dopant concentration;

a first region of the second conductivity type formed in the well, the first region having a dopant concentration greater than the dopant concentration of the well, the first region being connected to a first node;

a second region of the first conductivity type formed in the well, the second region having a dopant concentration greater than the dopant concentration of the semiconductor material;

a third region of the second conductivity type formed in the semiconductor material, the third region having a dopant concentration greater than the dopant concentration of the well, the third region being connected to a second node;

a fourth region of the first conductivity type formed in the semiconductor material, the fourth region having a dopant concentration greater than the dopant concentration of the semiconductor material;

a fifth region of the second conductivity type formed in the semiconductor material and the well, the fifth region having a dopant concentration greater than the dopant concentration of the well; and a diode connected between the second region and the first node, the method comprising the steps of:
placing a first voltage on the first region;
placing a second voltage on the second region, the first and second voltages being different; and
placing a third voltage on the third and fourth regions.

12. The method of claim 13 wherein the second voltage is less than the first voltage.

13. The method of claim 11 wherein the diode has a cathode connected to the second region, and an anode.

14. The method of claim 13 wherein the diode includes a plurality of diodes connected in series.

15. The method of claim 14 and further comprising:

a channel region defined in the semiconductor material between the third region and the fifth region; and a gate formed over the channel region.

16. The method of claim 15 wherein the diode includes a zener diode.

17. A method of operating a low-voltage triggering silicon-controlled rectifier (LVTSCR) formed in a semiconductor material of a first conductivity type, the semiconductor material having a dopant concentration, the LVTSCR comprising:

a well of a second conductivity type formed in the semiconductor material, the well having a dopant concentration;

a first region of the second conductivity type formed in the well, the first region having a dopant concentration greater than the dopant concentration of the well, the first region being connected to a first node;

a second region of the first conductivity type formed in the well, the second region having a dopant concentration greater than the dopant concentration of the semiconductor material, a third region of the second conductivity type formed in the semiconductor material, the third region having a dopant concentration greater than the dopant concentration of the well, the third region being connected to a second node;

a fourth region of the first conductivity type formed in the semiconductor material, the fourth region having a dopant concentration greater than the dopant concentration of the semiconductor material;

a fifth region of the second conductivity type formed in the semiconductor material and the well, the fifth region having a dopant concentration greater than the dopant concentration of the well; and a voltage drop circuit connected between the second region and the first node, the voltage drop circuit including a zener diode connected in series between the second region and the first node, the method comprising the steps of:
placing a first voltage on the first region;
placing a second voltage on the second region, the first and second voltages being different; and
placing a third voltage on the third and fourth regions.

18. The method of claim 17 and further comprising:

a channel region defined in the semiconductor material between the third region and the fifth region; and a gate formed over the channel region.

19. The method of claim 18 wherein the fourth region is connected to the second node.

* * * * *